(12) United States Patent
Cheng

(10) Patent No.: US 8,488,356 B2
(45) Date of Patent: *Jul. 16, 2013

(54) MEMORY SYSTEM WITH MULTI-LEVEL STATUS SIGNALING AND METHOD FOR OPERATING THE SAME

(75) Inventor: Steven Cheng, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/430,548

(22) Filed: Mar. 26, 2012

(65) Prior Publication Data

US 2012/0182780 A1   Jul. 19, 2012

Related U.S. Application Data

(63) Continuation of application No. 12/495,717, filed on Jun. 30, 2009, now Pat. No. 8,144,496.

(51) Int. Cl.
*G11C 5/06* (2006.01)

(52) U.S. Cl.
USPC .......................... 365/63; 365/185.03

(58) Field of Classification Search
USPC ................... 365/63, 185.03, 189.07
See application file for complete search history.

(56) References Cited

U.S. PATENT DOCUMENTS 7,978,516 B2 * 7/2011 Olbrich et al. ........... 365/185.11

* cited by examiner

*Primary Examiner* — Vu Le
(74) *Attorney, Agent, or Firm* — Martine Penilla Group, LLP

(57) ABSTRACT

A memory system includes a status circuit having a common status node electrically connected to a respective status pad of each of a plurality of memory chips. The memory system also includes a plurality of resistors disposed within the status circuit to define a voltage divider network for generating different voltage levels at the common status node. Each of the different voltage levels indicates a particular operational state combination of the plurality of memory chips. Also, each of the plurality of memory chips is either in a first operational state or a second operational state. Additionally, the different voltage levels are distributed within a voltage range extending from a power supply voltage level to a reference ground voltage level.

20 Claims, 8 Drawing Sheets

| Vcc | 3.0 V |
|---|---|
| $R_{PU}$ | 2000 ohm |

| $R_{CMP1}$ | 2000 ohm |
|---|---|
| $R_{CMP0}$ | 1000 ohm |

| $R_{CMP1}$ | $R_{CMP0}$ | $R_{CMP1} \| R_{CMP0}$ | $V_{Busy}$ | Vstep |
|---|---|---|---|---|
| 2000 ohm | 1000 ohm | 667 ohm | 2.25 V | 750 mV |
| HiZ | 1000 ohm | 1000 ohm | 2.00 V | 250 mV |
| 2000 ohm | HiZ | 2000 ohm | 1.50 V | 500 mV |
| HiZ | HiZ | HiZ | 3.00 V | 1500 mV |

Fig. 3

| Vcc | 3.0 V | | | | | | | |
|---|---|---|---|---|---|---|---|---|
| $R_{DP0\_1}$ | 0 ohm | | | | | | | |
| $R_{DP2\_3}$ | 0 ohm | | | | | | | |
| CE | # Chip Busy | $R_{PU}$ | $R_{D3}$ | $R_{D2}$ | $R_{D1}$ | $R_{D0}$ | $R_{PD}$ | $V_{Busy}$ | $V_{Step}$ |
| 0,1,2,3 | 0 | HiZ | HiZ | HiZ | HiZ | HiZ | HiZ | 3.00 V | 283 mV |
| 3 | 4 | 48000 ohm | 20000 ohm | 20000 ohm | 20000 ohm | 20000 ohm | 5000 ohm | 2.72 V | 83 mV |
| 3 | 3 | 48000 ohm | 20000 ohm | 20000 ohm | 20000 ohm | 1.E+11 | 6667 ohm | 2.63 V | |
| 3 | 3 | 48000 ohm | 1.E+11 | 20000 ohm | 20000 ohm | 20000 ohm | 6667 ohm | 2.63 V | |
| 3 | 3 | 48000 ohm | 20000 ohm | 1.E+11 | 20000 ohm | 20000 ohm | 6667 ohm | 2.63 V | |
| 3 | 3 | 48000 ohm | 20000 ohm | 20000 ohm | 1.E+11 | 20000 ohm | 6667 ohm | 2.63 V | 63 mV |
| 2 | 4 | 30000 ohm | 20000 ohm | 20000 ohm | 20000 ohm | 20000 ohm | 5000 ohm | 2.57 V | 89 mV |
| 3 | 2 | 48000 ohm | 1.E+11 | 1.E+11 | 20000 ohm | 20000 ohm | 10000 ohm | 2.48 V | |
| 3 | 2 | 48000 ohm | 1.E+11 | 20000 ohm | 1.E+11 | 20000 ohm | 10000 ohm | 2.48 V | |
| 3 | 2 | 48000 ohm | 20000 ohm | 1.E+11 | 1.E+11 | 20000 ohm | 10000 ohm | 2.48 V | |
| 3 | 2 | 48000 ohm | 1.E+11 | 20000 ohm | 20000 ohm | 1.E+11 | 10000 ohm | 2.48 V | |
| 3 | 2 | 48000 ohm | 20000 ohm | 1.E+11 | 20000 ohm | 1.E+11 | 10000 ohm | 2.48 V | |
| 3 | 2 | 48000 ohm | 20000 ohm | 20000 ohm | 1.E+11 | 1.E+11 | 10000 ohm | 2.48 V | 28 mV |
| 2 | 3 | 30000 ohm | 20000 ohm | 20000 ohm | 20000 ohm | 1.E+11 | 6667 ohm | 2.45 V | |
| 2 | 3 | 30000 ohm | 1.E+11 | 20000 ohm | 20000 ohm | 20000 ohm | 6667 ohm | 2.45 V | |
| 2 | 3 | 30000 ohm | 20000 ohm | 1.E+11 | 20000 ohm | 20000 ohm | 6667 ohm | 2.45 V | |
| 2 | 3 | 30000 ohm | 20000 ohm | 20000 ohm | 1.E+11 | 20000 ohm | 6667 ohm | 2.45 V | 205 mV |
| 2 | 2 | 30000 ohm | 1.E+11 | 1.E+11 | 20000 ohm | 20000 ohm | 10000 ohm | 2.25 V | |
| 2 | 2 | 30000 ohm | 1.E+11 | 20000 ohm | 1.E+11 | 20000 ohm | 10000 ohm | 2.25 V | |
| 2 | 2 | 30000 ohm | 20000 ohm | 1.E+11 | 1.E+11 | 20000 ohm | 10000 ohm | 2.25 V | |
| 2 | 2 | 30000 ohm | 1.E+11 | 20000 ohm | 20000 ohm | 1.E+11 | 10000 ohm | 2.25 V | |
| 2 | 2 | 30000 ohm | 20000 ohm | 20000 ohm | 1.E+11 | 1.E+11 | 10000 ohm | 2.25 V | 31 mV |
| 1 | 4 | 14200 ohm | 20000 ohm | 20000 ohm | 20000 ohm | 20000 ohm | 5000 ohm | 2.22 V | 101 mV |
| 3 | 1 | 48000 ohm | 1.E+11 | 1.E+11 | 1.E+11 | 20000 ohm | 20000 ohm | 2.12 V | |
| 3 | 1 | 48000 ohm | 1.E+11 | 1.E+11 | 20000 ohm | 1.E+11 | 20000 ohm | 2.12 V | |
| 3 | 1 | 48000 ohm | 1.E+11 | 20000 ohm | 1.E+11 | 1.E+11 | 20000 ohm | 2.12 V | |
| 3 | 1 | 48000 ohm | 20000 ohm | 1.E+11 | 1.E+11 | 1.E+11 | 20000 ohm | 2.12 V | 76 mV |
| 1 | 3 | 14200 ohm | 20000 ohm | 20000 ohm | 20000 ohm | 1.E+11 | 6667 ohm | 2.04 V | |
| 1 | 3 | 14200 ohm | 1.E+11 | 20000 ohm | 20000 ohm | 20000 ohm | 6667 ohm | 2.04 V | |
| 1 | 3 | 14200 ohm | 20000 ohm | 1.E+11 | 20000 ohm | 20000 ohm | 6667 ohm | 2.04 V | |
| 1 | 3 | 14200 ohm | 20000 ohm | 20000 ohm | 1.E+11 | 20000 ohm | 6667 ohm | 2.04 V | 242 mV |
| 2 | 1 | 30000 ohm | 1.E+11 | 1.E+11 | 1.E+11 | 20000 ohm | 20000 ohm | 1.80 V | |
| 2 | 1 | 30000 ohm | 1.E+11 | 1.E+11 | 20000 ohm | 1.E+11 | 20000 ohm | 1.80 V | |
| 2 | 1 | 30000 ohm | 1.E+11 | 20000 ohm | 1.E+11 | 1.E+11 | 20000 ohm | 1.80 V | |
| 2 | 1 | 30000 ohm | 20000 ohm | 1.E+11 | 1.E+11 | 1.E+11 | 20000 ohm | 1.80 V | 40 mV |
| 1 | 2 | 14200 ohm | 1.E+11 | 1.E+11 | 20000 ohm | 20000 ohm | 10000 ohm | 1.76 V | |
| 1 | 2 | 14200 ohm | 1.E+11 | 20000 ohm | 1.E+11 | 20000 ohm | 10000 ohm | 1.76 V | |
| 1 | 2 | 14200 ohm | 20000 ohm | 1.E+11 | 1.E+11 | 20000 ohm | 10000 ohm | 1.76 V | |
| 1 | 2 | 14200 ohm | 1.E+11 | 20000 ohm | 20000 ohm | 1.E+11 | 10000 ohm | 1.76 V | |
| 1 | 2 | 14200 ohm | 20000 ohm | 20000 ohm | 1.E+11 | 1.E+11 | 10000 ohm | 1.76 V | 515 mV |
| 1 | 1 | 14200 ohm | 1.E+11 | 1.E+11 | 1.E+11 | 20000 ohm | 20000 ohm | 1.25 V | |
| 1 | 1 | 14200 ohm | 1.E+11 | 1.E+11 | 20000 ohm | 1.E+11 | 20000 ohm | 1.25 V | |
| 1 | 1 | 14200 ohm | 1.E+11 | 20000 ohm | 1.E+11 | 1.E+11 | 20000 ohm | 1.25 V | |
| 1 | 1 | 14200 ohm | 20000 ohm | 1.E+11 | 1.E+11 | 1.E+11 | 20000 ohm | 1.25 V | 746 mV |
| 0 | 4 | 1000 ohm | 20000 ohm | 20000 ohm | 20000 ohm | 20000 ohm | 5000 ohm | 0.50 V | 109 mV |
| 0 | 3 | 1000 ohm | 20000 ohm | 20000 ohm | 20000 ohm | 1.E+11 | 6667 ohm | 0.39 V | |
| 0 | 3 | 1000 ohm | 1.E+11 | 20000 ohm | 20000 ohm | 20000 ohm | 6667 ohm | 0.39 V | |
| 0 | 3 | 1000 ohm | 20000 ohm | 1.E+11 | 20000 ohm | 20000 ohm | 6667 ohm | 0.39 V | |
| 0 | 3 | 1000 ohm | 20000 ohm | 20000 ohm | 1.E+11 | 20000 ohm | 6667 ohm | 0.39 V | 119 mV |
| 0 | 2 | 1000 ohm | 1.E+11 | 1.E+11 | 20000 ohm | 20000 ohm | 10000 ohm | 0.27 V | |
| 0 | 2 | 1000 ohm | 1.E+11 | 20000 ohm | 1.E+11 | 20000 ohm | 10000 ohm | 0.27 V | |
| 0 | 2 | 1000 ohm | 20000 ohm | 1.E+11 | 1.E+11 | 20000 ohm | 10000 ohm | 0.27 V | |
| 0 | 2 | 1000 ohm | 1.E+11 | 20000 ohm | 20000 ohm | 1.E+11 | 10000 ohm | 0.27 V | |
| 0 | 2 | 1000 ohm | 20000 ohm | 1.E+11 | 20000 ohm | 1.E+11 | 10000 ohm | 0.27 V | |
| 0 | 2 | 1000 ohm | 20000 ohm | 20000 ohm | 1.E+11 | 1.E+11 | 10000 ohm | 0.27 V | 130 mV |
| 0 | 1 | 1000 ohm | 1.E+11 | 1.E+11 | 1.E+11 | 20000 ohm | 20000 ohm | 0.14 V | |
| 0 | 1 | 1000 ohm | 1.E+11 | 1.E+11 | 20000 ohm | 1.E+11 | 20000 ohm | 0.14 V | |
| 0 | 1 | 1000 ohm | 1.E+11 | 20000 ohm | 1.E+11 | 1.E+11 | 20000 ohm | 0.14 V | |
| 0 | 1 | 1000 ohm | 20000 ohm | 1.E+11 | 1.E+11 | 1.E+11 | 20000 ohm | 0.14 V | |

Fig. 5

| V_CC | 3.0 V | | | | | | | | | |
|---|---|---|---|---|---|---|---|---|---|---|
| R_DP0_1 | 3500 ohm | | | | | | | | | |
| R_DP2_3 | 5250 ohm | | | | | | | | | |
| CE | R_PU | R_D3 | R_D2 | R_D1 | R_D0 | R_D3‖R_D2 | R_D1‖R_D0 | R_PD | V_Busy | V_Step |
| 0 | 64000 ohm | 5000 ohm | 4000 ohm | 2750 ohm | 1750 ohm | 2222 ohm | 1069 ohm | 2835 ohm | 2.87 V | 127 mV |
|  | 64000 ohm | HiZ | HiZ | 2750 ohm | 1750 ohm | HiZ | 1069 ohm | 4569 ohm | 2.80 V | 73 mV |
|  | 64000 ohm | HiZ | HiZ | HiZ | 1750 ohm | HiZ | 1750 ohm | 5250 ohm | 2.77 V | 28 mV |
|  | 64000 ohm | HiZ | HiZ | 2750 ohm | HiZ | HiZ | 2750 ohm | 6250 ohm | 2.73 V | 39 mV |
|  | 64000 ohm | 5000 ohm | 4000 ohm | HiZ | HiZ | 2222 ohm | HiZ | 7472 ohm | 2.69 V | 47 mV |
|  | 64000 ohm | HiZ | 4000 ohm | HiZ | HiZ | 4000 ohm | HiZ | 9250 ohm | 2.62 V | 65 mV |
|  | 64000 ohm | 5000 ohm | HiZ | HiZ | HiZ | 5000 ohm | HiZ | 10250 ohm | 2.59 V | 35 mV |
| 1 | 16000 ohm | 5000 ohm | 4000 ohm | 2750 ohm | 1750 ohm | 2222 ohm | 1069 ohm | 2835 ohm | 2.55 V | 37 mV |
|  | 16000 ohm | HiZ | HiZ | 2750 ohm | 1750 ohm | HiZ | 1069 ohm | 4569 ohm | 2.33 V | 215 mV |
|  | 16000 ohm | HiZ | HiZ | HiZ | 1750 ohm | HiZ | 1750 ohm | 5250 ohm | 2.26 V | 75 mV |
|  | 16000 ohm | HiZ | HiZ | 2750 ohm | HiZ | HiZ | 2750 ohm | 6250 ohm | 2.16 V | 102 mV |
|  | 16000 ohm | 5000 ohm | 4000 ohm | HiZ | HiZ | 2222 ohm | HiZ | 7472 ohm | 2.04 V | 112 mV |
|  | 16000 ohm | HiZ | 4000 ohm | HiZ | HiZ | 4000 ohm | HiZ | 9250 ohm | 1.90 V | 144 mV |
|  | 16000 ohm | 5000 ohm | HiZ | HiZ | HiZ | 5000 ohm | HiZ | 10250 ohm | 1.83 V | 72 mV |
| 2 | 4000 ohm | 5000 ohm | 4000 ohm | 2750 ohm | 1750 ohm | 2222 ohm | 1069 ohm | 2835 ohm | 1.76 V | 73 mV |
|  | 4000 ohm | HiZ | HiZ | 2750 ohm | 1750 ohm | HiZ | 1069 ohm | 4569 ohm | 1.40 V | 355 mV |
|  | 4000 ohm | HiZ | HiZ | HiZ | 1750 ohm | HiZ | 1750 ohm | 5250 ohm | 1.30 V | 103 mV |
|  | 4000 ohm | HiZ | HiZ | 2750 ohm | HiZ | HiZ | 2750 ohm | 6250 ohm | 1.17 V | 127 mV |
|  | 4000 ohm | 5000 ohm | 4000 ohm | HiZ | HiZ | 2222 ohm | HiZ | 7472 ohm | 1.05 V | 125 mV |
|  | 4000 ohm | HiZ | 4000 ohm | HiZ | HiZ | 4000 ohm | HiZ | 9250 ohm | 0.91 V | 140 mV |
|  | 4000 ohm | 5000 ohm | HiZ | HiZ | HiZ | 5000 ohm | HiZ | 10250 ohm | 0.84 V | 64 mV |
| 3 | 1000 ohm | 5000 ohm | 4000 ohm | 2750 ohm | 1750 ohm | 2222 ohm | 1069 ohm | 2835 ohm | 0.78 V | 60 mV |
|  | 1000 ohm | HiZ | HiZ | 2750 ohm | 1750 ohm | HiZ | 1069 ohm | 4569 ohm | 0.54 V | 244 mV |
|  | 1000 ohm | HiZ | HiZ | HiZ | 1750 ohm | HiZ | 1750 ohm | 5250 ohm | 0.48 V | 59 mV |
|  | 1000 ohm | HiZ | HiZ | 2750 ohm | HiZ | HiZ | 2750 ohm | 6250 ohm | 0.41 V | 66 mV |
|  | 1000 ohm | 5000 ohm | 4000 ohm | HiZ | HiZ | 2222 ohm | HiZ | 7472 ohm | 0.35 V | 60 mV |
|  | 1000 ohm | HiZ | 4000 ohm | HiZ | HiZ | 4000 ohm | HiZ | 9250 ohm | 0.29 V | 61 mV |
|  | 1000 ohm | 5000 ohm | HiZ | HiZ | HiZ | 5000 ohm | HiZ | 10250 ohm | 0.27 V | 26 mV |
| 0,1,2,3 | HiZ | HiZ | HiZ | HiZ | HiZ | HiZ | HiZ | HiZ | 3.00 V | 2733 mV |

Fig. 7

MEMORY SYSTEM WITH MULTI-LEVEL STATUS SIGNALING AND METHOD FOR OPERATING THE SAME

CLAIM OF PRIORITY

This application is a continuation application under 35 U.S.C. 120 of prior U.S. application Ser. No. 12/495,717, filed Jun. 30, 2009 now U.S. Pat. No. 8,144,496, and entitled "Memory System with Multi-Level Status Signaling and Method for Operating the Same," which is incorporated herein by reference in its entirety.

BACKGROUND

Modern memory systems include multiple memory chips that can be operated independently such that some memory chips can be busy processing instructions at a given time while others are idle and ready to receive instructions to process. Conventional memory systems include an operational status indicator that conveys a binomial logic signal indicating a first logic, e.g., logic 0, state when any one or more of the memory chips in the memory system are busy processing instructions, and a second logic state (opposite of the first logic state), e.g., logic 1, only when all memory chips in the memory system are idle and ready to receive instructions. It should also be understood that this status signaling approach is unable to identify how many or which particular memory chips are busy versus idle.

While the above-mentioned status signaling approach may be acceptable in small memory systems that include a very small number of memory chips, it should be appreciated that with a larger number of memory chips inefficiencies manifest in the above-mentioned status signaling approach. For example, if only one of the larger number of memory chips is busy, a memory controller will not receive a ready status signal and will have to wait to send additional instructions to the presently idle memory chips until the one busy memory chip completes its processing operations and becomes idle, even though the other idle memory chips are ready to receive instructions. Hence, the memory controller is not able to discern from the binomial logic status signal which one of the memory chips is busy. In view of the foregoing, more intelligent solutions are sought for status signaling in memory systems.

SUMMARY

In one embodiment, a memory system is disclosed. The memory system includes a status circuit having a common status node electrically connected to a respective status pad of each of a plurality of memory chips. The memory system also includes a plurality of resistors disposed within the status circuit to define a voltage divider network for generating different voltage levels at the common status node. Each of the different voltage levels indicates a particular operational state combination of the plurality of memory chips. Also, each of the plurality of memory chips is either in a first operational state or a second operational state. Additionally, the different voltage levels are distributed within a voltage range extending from a power supply voltage level to a reference ground voltage level.

In one embodiment, a memory system including a component level status indicator circuit is disclosed. The memory system includes a plurality of memory components that each including a respective status pin defined to communicate an electrical signal indicating a memory component status. The memory system also includes a plurality of resistors respectively connected between the status pins of the plurality of memory components and a system level status node. Each of the plurality of resistors has a different resistance level. Also, the plurality of resistors form a voltage divider network such that electric current flow through each unique combination of status pins of the plurality of memory components generates a unique voltage at the system level status node. The unique voltage indicates which ones of the plurality of memory components are in a first operational state and which ones of the plurality of memory components are in a second operational state.

In one embodiment, a memory system including a chip level status indicator circuit is disclosed. The memory system includes a plurality of memory chips. Each of the plurality of memory chips includes a status pad. An electrical signal present at a given status pad indicates an operational status of the memory chip that includes the given status pad. Each of the plurality of memory chips also includes a status circuit extending from the status pad to a reference ground potential and including an open-drain output device and a first resistor, both serially connected between the status pad and the reference ground potential. The status pads of the plurality of memory chips are connected to a common status node. The first resistors of the plurality of memory chips form a voltage divider network such that electric current flow through the status pads of different numbers of the plurality of memory chips respectively generates different voltage levels at the common status node. Each of the different voltage levels at the common status node indicates how many of the plurality of memory chips are in a first operational state and how many of the plurality of memory chips are in a second operational state.

In one embodiment, a memory system including a chip level status indicator circuit is disclosed. The memory system includes a plurality of memory chips. Each of the plurality of memory chips includes a status pad. An electrical signal present at a given status pad indicates an operational status of the memory chip that includes the given status pad. Each of the plurality of memory chips also includes a status circuit extending from the status pad to a reference ground potential. The status circuit includes an open-drain output device and a first resistor both serially connected between the status pad and the reference ground potential. Each of the first resistors has a different resistance level. The memory system also includes a number of second resistors. Each second resistor is connected between a unique pair of status pads and a common status node such that each status pad is connected to one of the second resistors. Each of the number of second resistors has a different resistance level. The first resistors of the plurality of memory chips and the second resistors form a voltage divider network such that electric current flow through the status circuits of each unique combination of the plurality of memory chips generates a unique voltage level at the common status node. The unique voltage level indicates which one or more of the plurality of memory chips are in a first operational state and which one or more of the plurality of memory chips are in a second operational state.

In one embodiment, a method is disclosed for operating a memory system. The method includes operating a status circuit of the memory system. The status circuit includes a common status node electrically connected to a respective status pad of each of a plurality of memory chips. The status circuit further includes a plurality of resistors disposed to define a voltage divider network for generating different voltage levels at the common status node. Each of the different voltage levels indicates a particular operational state combination of the plurality of memory chips. Each of the plurality of memory chips is either in a first operational state or a second operational state. Also, the different voltage levels are distributed within a voltage range extending from a power supply voltage level to a reference ground voltage level. The method also includes an operation for measuring a voltage level at the common status node. The method further includes using the measured voltage level to determine which of the plurality of memory chips are in the first operational state and which of the plurality of memory chips are in the second operational state.

In one embodiment, a memory system is disclosed to include a status circuit having a common status node electrically connected to a respective status pad of each of a plurality of memory chips. A plurality of resistors are disposed within the status circuit to define a voltage divider network for generating different voltage levels at the common status node. Each of the different voltage levels indicates a particular operational state combination of the plurality of memory chips.

In one embodiment, a memory system including a component level status indicator circuit is disclosed. The memory system includes a plurality of memory components each including a respective status pin defined to communicate an electrical signal indicating a memory component status. The memory system also includes a plurality of resistors respectively connected between the status pins of the plurality of memory components and a system level status node. The plurality of resistors defined to generate a voltage at the system level status node indicating which ones of the plurality of memory components are in a first operational state and which ones of the plurality of memory components are in a second operational state.

In one embodiment, a method is disclosed for operating a memory system. The method includes operating a plurality of memory chips such that each of the plurality of memory chips is in any given one of a plurality of operational states. The method also includes generating a different voltage level at a common status node for each unique combination of operational states of the plurality of memory chips.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 3 shows a table illustrating an example operation of the component level status indication circuit of memory system, in accordance with one embodiment of the present invention;

FIG. 5 shows a table illustrating an example operation of the chip level status indication circuit of memory system, in accordance with one embodiment of the present invention;

FIG. 7 shows a table illustrating an example operation of the chip level status indication circuit of memory system, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
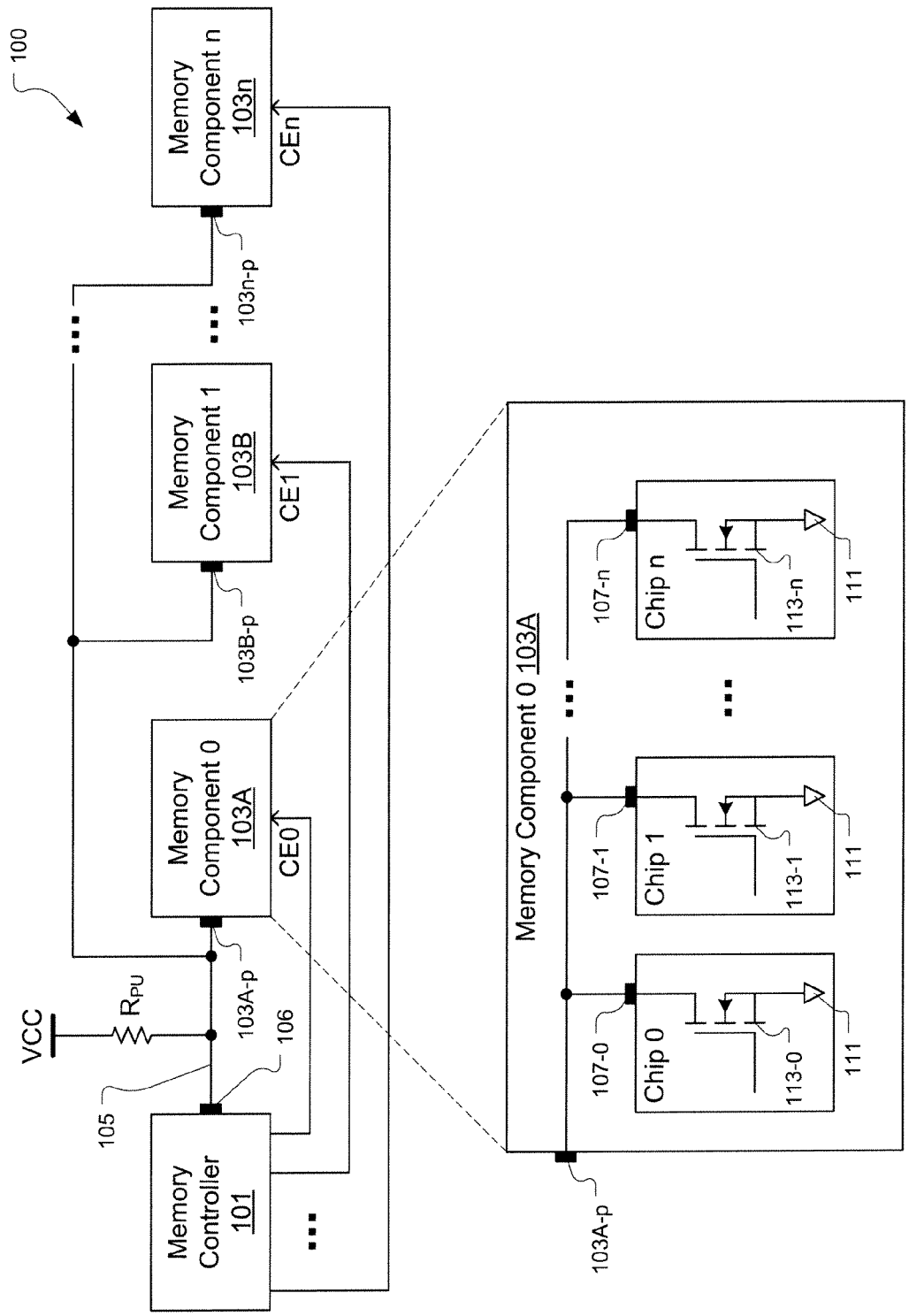
FIG. 1 shows a memory system defined to provide a single-level status indication circuit, in accordance with one embodiment of the present invention.

FIG. 1 shows a memory system 100 defined to provide a single-level status indication circuit, in accordance with one embodiment of the present invention. The system 100 includes a memory controller 101 and a number of memory components (103A-103n). In one embodiment, the memory controller 101 is a flash memory controller and the memory components (103A-103n) are flash memory components. Each memory component (103A-103n) includes a respective status pin (103A-p-103n-p). Each of the memory component status pins (103A-p-103n-p) is electrically connected to a common status node 105. The common status node 105 is electrically connected to a status port 106 of the memory controller 101. A status signal placed on the common status node 105 by the memory components (103A-103n) through their respective memory component status pins (103A-p-103n-p) is monitored by the memory controller 101 to determine whether or not the memory system 100 as a whole is in either a busy operational state or an idle state. In this embodiment, the busy operational state indicates that at least one memory component (103A-103n) is busy processing an instruction. In this embodiment, the idle state indicates that all memory components (103A-103n) are idle and waiting to receive an instruction to process. It should be understood that the busy operational state and the idle state can be generalized to a first operational state and a second operational state, respectively.

FIG. 1 also shows an expanded view of the memory component 0 (103A) status circuit. It should be understood that the memory component 0 (103A) status circuit is exemplary of the status circuits within the other memory components 1-n (103B-103n). The memory component 0 (103A) status circuit includes an electrical connection between the status pin 103A-p and each of a number of status pads (107-0-107-n) corresponding to a number of memory chips (Chip 0-Chip n). The status circuit within each memory chip (Chip 0-Chip n) includes a respective open-drain device (113-0-113-n) electrically connected between the respective status pad (107-0-107-n) and a reference ground potential 111, i.e., a reference ground voltage level. The open-drain device (113-0-113-n) within a given memory chip (Chip 0-Chip n) is defined and connected to enable electric current flow through the status pad (107-0-107-n) of the given memory chip (Chip 0-Chip n) to the reference ground potential 111, when the given memory chip (Chip 0-Chip n) is in the busy operational state. Also, the open-drain device (113-0-113-n) within a given memory chip (Chip 0-Chip n) is defined and connected to prevent electric current flow through the status pad (107-0-107-n) of the given memory chip (Chip 0-Chip n) to the reference ground potential 111, when the given memory chip (Chip 0-Chip n) is in the idle operational state.

The common status node 105 is also electrically connected to a power supply voltage (VCC) through a pull up resistor ($R_{PU}$). As discussed above, when all memory components (103A-103n) are in the idle state, electric current flow through their respective open-drain output devices (113-0-113-n) is prevented. In this situation, connection of the common status node 105 to the power supply voltage (VCC) through the pull up resistor ($R_{PU}$) causes the common status node 105 to maintain a voltage level indicative of a high logic state (logic 1). Thus, in the single-level status indication circuit of the memory system 100, the voltage level indicating the high logic state (logic 1) at the common status node 105 is a default condition and is indicative that all memory components (103A-103n) are in the idle operational state. Further, when any of the memory components (103A-103n) are busy processing an instruction, its corresponding open-drain output device (113-0-113-n) allows electric current flow from the common status node 105 to the reference ground potential 111. Thus, in the single-level status indication circuit of the memory system 100, when any of the memory components (103A-103n) are busy processing an instruction, the voltage level at the common status node 105 drops to the reference ground voltage level 111 indicating a low logic state (logic 0). In this manner, the memory controller 101 is able to determine whether or not at least one of the memory components (103A-103n) is in the busy operational state, or whether all of the memory components (103A-103n) are in the idle operational state, i.e., are ready to receive instructions.

Additionally, in one embodiment, the memory controller 101 is defined to generate and transmit chip enable signals (CE0-CEn) to the memory components (103A-103n), respectively. In one embodiment, transmission of a given chip enable signal (CE0-CEn) is accompanied by a status polling command, which causes the voltage at the common status node to reflect the particular memory component(s) status corresponding to the given chip enable signal(s) that is/are transmitted. In this manner, the memory controller 101 can poll the memory components (103A-103n) to obtain a more detailed understanding of the operational status of the memory system 100. However, it should be appreciated that polling of the memory components (103A-103n) can increase the power consumption of the memory system 100 by a factor proportional to the polling rate. Moreover, it should be appreciated that in the absence of polling the memory components (103A-103n), it is necessary to wait for the voltage at the common status node 105 to indicate that all memory components (103A-103n) have become idle before knowing for sure that any particular memory component is idle. This may cause an inefficiency in operation of the memory system 100 in that the memory controller 101 may unnecessarily delay sending of instructions to selected memory components that are in fact idle, i.e., ready to receive the instructions, because the memory controller 101 cannot tell from the common status node 105 that the selected memory components are in fact idle until all memory components have become idle.

Memory system embodiments are disclosed herein that include status circuit implementations which provide different voltage levels at the common status node monitored by the memory controller, wherein each of the different voltage levels indicates either which memory components are busy versus idle, how many memory chips are busy versus idle (in one or more memory components), or which memory chips are busy versus idle (in one or more memory components).

Figure 2:
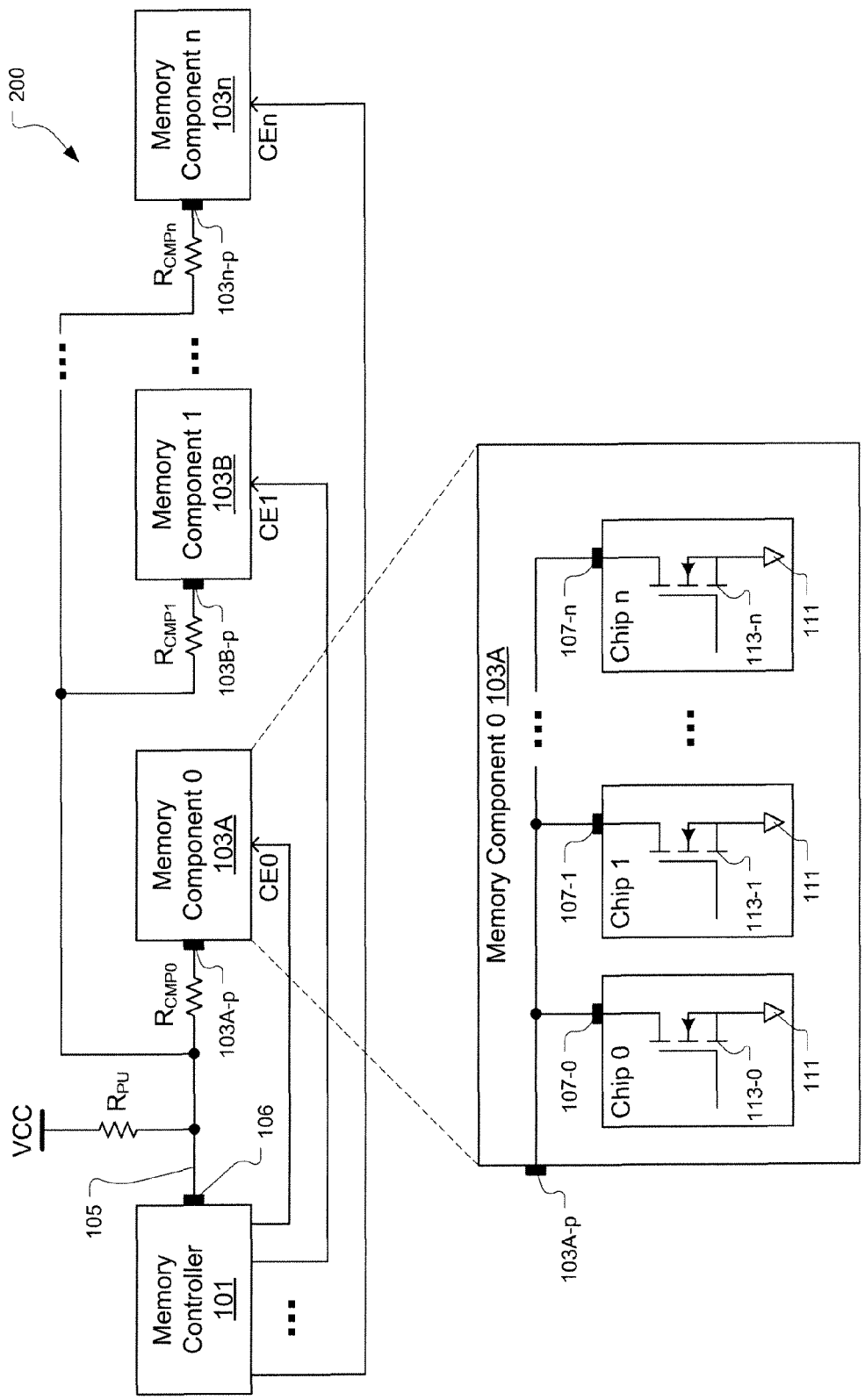
FIG. 2 shows a memory system defined to provide a component level status indication circuit, in accordance with one embodiment of the present invention.

FIG. 2 shows a memory system 200 defined to provide a component level status indication circuit, in accordance with one embodiment of the present invention. The system 200 includes the memory controller 101 and the memory components (103A-103n), as previously described with regard to FIG. 1. In the component level status indication circuit, resistors ($R_{CMP0}$-$R_{CMPn}$) are electrically connected between the status pins of memory components (103A-103n), respectively, and the common status node 105. The resistors ($R_{CMP0}$-$R_{CMPn}$) form a voltage divider network such that electric current flow through a different number of the status pins (103A-p-103n-p) of the memory components (103A-103n) generates a unique voltage at the common status node 105, i.e., at the system level status node 105. The unique voltage at the common status node 105 indicates which ones of the memory components (103A-103n) are in a first operational state and which of the memory components (103A-103n) are in a second operational state. In one embodiment, the first operational state of a given memory component is a busy operational state indicating that the given memory component is processing an instruction. Also, in this embodiment, the second operational state of the given memory component is a ready state indicating that the given memory component is idle and waiting to receive an instruction to process.

In one embodiment, a resistance value of each of the resistors ($R_{CMP0}$-$R_{CMPn}$) is substantially equal. In this embodiment, a particular voltage level at the common status node 105 indicates how many of the memory components (103A-103n) are in the busy operational state versus the ready (idle) operational state. In another embodiment, a resistance value of each of the resistors ($R_{CMP0}$-$R_{CMPn}$) is unique. In this embodiment, a particular voltage level at the common status node 105 indicates a particular combination of the memory components (103A-103n) in the busy operational state versus the ready (idle) operational state.

FIG. 3 shows a table illustrating an example operation of the component level status indication circuit of memory system 200, in accordance with one embodiment of the present invention. In the example of FIG. 3, there are two memory components, memory component 0 (103A) and memory component 1 (103B). The resistor $R_{CMP0}$ has a resistance value of 1000 ohms, and the resistor $R_{CMP1}$ has a resistance value of 2000 ohms, such that the parallel resistance of resistors $R_{CMP1}$ and $R_{CMP1}$ is 667 ohms. When both memory components 0 and 1 (103A and 103B) are in the busy operational state, electric current flows through both resistors $R_{CMP0}$ and $R_{CMP1}$, thereby establishing a voltage level of 2.25 V at the common status node, which corresponds to a voltage step of 750 millivolts (mV) from the supply voltage level (VCC) of 3.00 V. When memory component 0 (103A) is in the busy operational state and memory component 1 (103B) is in the ready operational state, electric current flows through resistor $R_{CMP0}$, but not through resistor $R_{CMP1}$, thereby establishing a voltage level of 2.00 V at the common status node, which corresponds to a voltage step of 250 mV from the next highest voltage level (2.25 V) possible at the common status node 105.

When memory component 0 (103A) is in the ready operational state and memory component 1 (103B) is in the busy operational state, electric current flows through resistor $R_{CMP1}$, but not through resistor $R_{CMP0}$, thereby establishing a voltage level of 1.50 V at the common status node, which corresponds to a voltage step of 500 mV from the next highest voltage level (2.00 V) possible at the common status node 105. When both memory components 0 and 1 (103A and 103B) are in the ready operational state, electric current does not flow through either of resistors $R_{CMP0}$ and $R_{CMP1}$, thereby establishing the supply level voltage level of 3.00 V at the common status node 105.

Given the structure of the component level status indication circuit of FIG. 2 and the example operation of FIG. 3, it should be understood that the voltage divider network formed by the resistors ($R_{CMP0}$-$R_{CMPn}$) allows the combined operational status of the memory components (103A-103n) to be gleaned from measurement of the single voltage level value at the common status node 105. Further, if each of the resistors ($R_{CMP0}$-$R_{CMPn}$) have an equal resistance value, then the single voltage level value measured at the common status node will indicate how many of the memory components (103A-103n) are busy versus ready. Additionally, if each of the resistors ($R_{CMP0}$)-$R_{CMPn}$) has a different, i.e., unique, resistance value, then the single voltage level value measured at the common status node will indicate which particular memory components (103A-103n) are busy versus ready.

Figure 4:
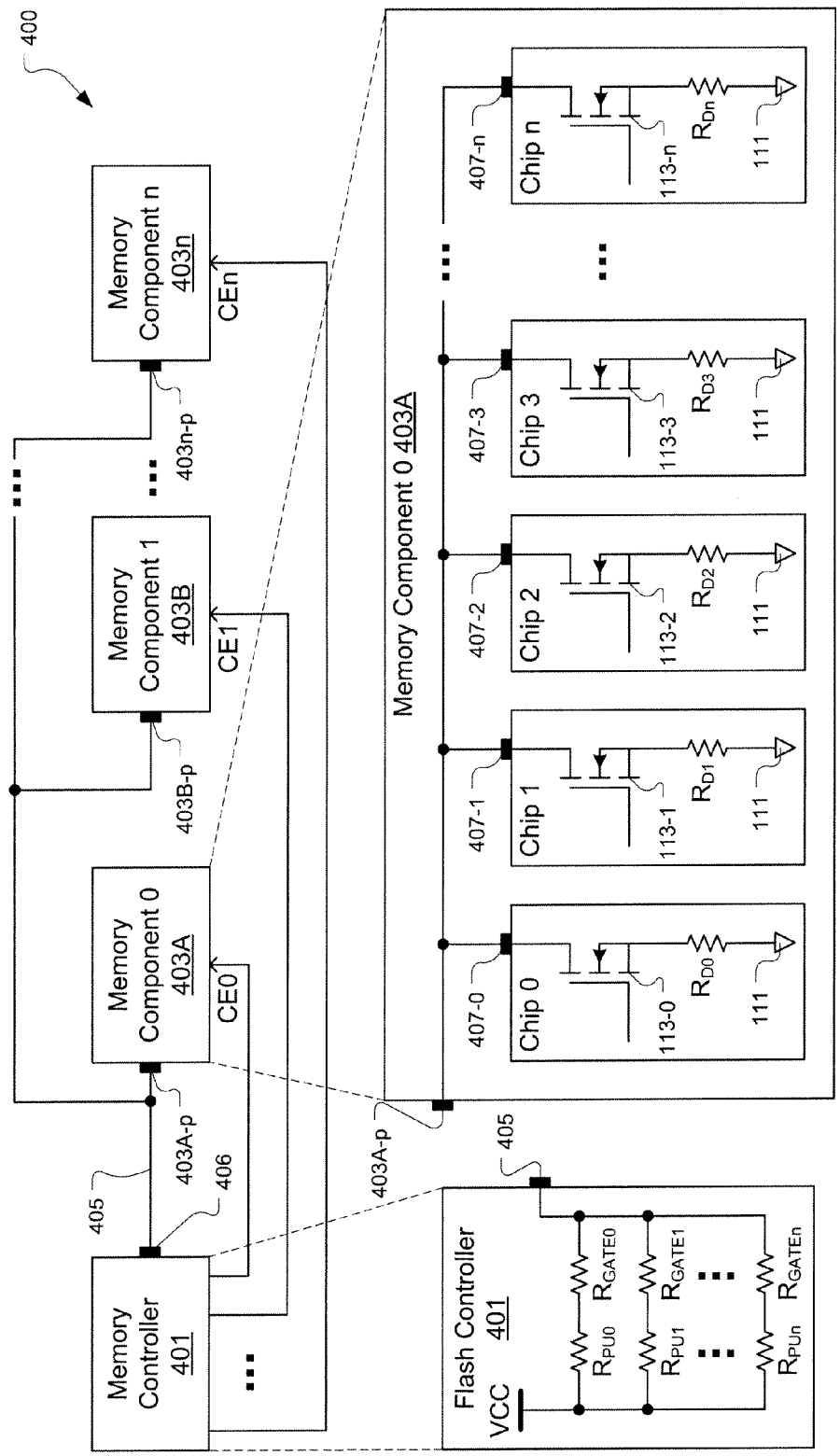
FIG. 4 shows a memory system defined to provide a chip-level status indication circuit, in accordance with one embodiment of the present invention.

FIG. 4 shows a memory system 400 defined to provide a chip-level status indication circuit, in accordance with one embodiment of the present invention. The system 400 includes a memory controller 401 and a number of memory components (403A-403n). In one embodiment, the memory controller 401 is a flash memory controller and the memory components (403A-403n) are flash memory components. Each memory component (403A-403n) includes a respective status pin (403A-p-403n-p). Each of the memory component status pins (403A-p-403n-p) is electrically connected to a common status node 405. The common status node 405 is electrically connected to a status port 406 of the memory controller 401.

FIG. 4 also shows an expanded view of the memory component 0 (403A) status circuit. It should be understood that the memory component 0 (403A) status circuit is exemplary of the status circuits within the other memory components 1-n (403B-403n). The memory component 0 (403A) status circuit includes an electrical connection between the status pin 403A-p and each of a number of status pads (407-0-407-n) corresponding to a number of memory chips (Chip 0-Chip n). The status circuit within each memory chip (Chip 0-Chip n) includes a respective open-drain device (113-0-113-n) electrically connected between the respective status pad (407-0-407-n) and a reference ground potential 111, i.e., a reference ground voltage level.

The open-drain device (113-0-113-n) within a given memory chip (Chip 0-Chip n) is defined and connected to enable electric current flow through the status pad (407-0-407-n) of the given memory chip (Chip 0-Chip n) to the reference ground potential 111, when the given memory chip (Chip 0-Chip n) is in the busy operational state. Also, the open-drain device (113-0-113-n) within a given memory chip (Chip 0-Chip n) is defined and connected to prevent electric current flow through the status pad (407-0-407-n) of the given memory chip (Chip 0-Chip n) to the reference ground potential 111, when the given memory chip (Chip 0-Chip n) is in the idle operational state.

Additionally, in the chip level status indication circuit, resistors ($R_{D0}$-$R_{Dn}$) are electrically connected between the status pads (407-0-407-n) of memory components (403A-403n), respectively, and the reference ground potential 111. In the exemplary embodiment of FIG. 4, the resistors ($R_{D0}$-$R_{Dn}$) are electrically connected between the open-drain devices (113-0-113-n), respectively, and the reference ground potential 111. However, in another embodiment, the resistors ($R_{D0}$-$R_{Dn}$) can be electrically connected between the open-drain devices (113-0-113-n), respectively, and the corresponding status pads (407-0-407-n). Also, in the exemplary embodiment of FIG. 4, the resistors ($R_{D0}$-$R_{Dn}$) are disposed within the memory chips (407-0-407-n), respectively. In this embodiment, the resistors ($R_{D0}$-$R_{Dn}$) can be identically defined to enable identical manufacture of the memory chips (407-0-407-n). However, in another embodiment, the resistors ($R_{D0}$-$R_{Dn}$) can be disposed outside the memory chips (407-0-407-n), respectively, so as to electrically connect with a corresponding interface of the memory chips (407-0-407-n). In this embodiment, the resistors ($R_{D0}$-$R_{Dn}$) can differ without requiring the memory chips (407-0-407-n) to be different.

The resistors ($R_{D0}$-$R_{Dn}$) form a voltage divider network such that electric current flow through a different number of the status pads (407-0-407-n) of the memory chips (103A-103n) generates different voltage levels at the common status node 405, i.e., at the system level status node 405. In the embodiment where each of the resistors ($R_{D0}$-$R_{Dn}$) has an equal resistance value, each of the different voltage levels at the common status node 405 indicates how many of the memory chips (407-0-407-n) are in a first operational state and how many of the memory chips (407-0-407-n) are in a second operational state. In the embodiment where each of the resistors ($R_{D0}$-$R_{Dn}$) has a different resistance value, each of the different voltage levels at the common status node 405 indicates which ones of the memory chips (407-0-407-n) are in a first operational state and which ones of the memory chips (407-0-407-n) are in a second operational state. In one embodiment, the first operational state of a given memory chip is a busy operational state indicating that the given memory component is processing an instruction. Also, in this embodiment, the second operational state of the given memory chip is a ready state indicating that the given memory component is idle and waiting to receive an instruction to process.

FIG. 4 further shows that the common status node 405 is also electrically connected to a power supply voltage (VCC) through a number of pull up resistors ($R_{PU0}$-$R_{PUn}$). In the example embodiment of FIG. 4, the pull up resistors ($R_{PU0}$-$R_{PUn}$) are shown as being disposed in the memory controller 401. However, it should be understood that in other embodiments, the pull up resistors ($R_{PU0}$-$R_{PUn}$) can be disposed outside the memory controller 401 so long as the pull up resistors ($R_{PU0}$-$R_{PUn}$) are electrically connected between the power supply voltage (VCC) and the common status node 405.

The pull up resistors ($R_{PU0}$-$R_{PUn}$) are respectively associated with the memory components (403A-403n). Each of the pull up resistors ($R_{PU0}$-$R_{PUn}$) is serially connected to a respective gate, represented as resistors ($R_{GATE0}$-$R_{GATEn}$), which is controllable as a switch to enable or disable electric current flow through a branch including the respective gate. Therefore, the gate resistors ($R_{GATE0}$-$R_{GATEn}$) are used to control which pull up resistors ($R_{PU0}$-$R_{PUn}$) are active in the chip-level status indication circuit of the memory system 400. In one embodiment, control of the gate resistors ($R_{GATE0}$-$R_{GATEn}$) is tied to chip enable signals (CE0-CEn) associated with the memory components (403A-403n), such that assertion of a given chip enable signal (CE0-CEn) will cause the corresponding gate resistor ($R_{GATE0}$ $R_{GATEn}$) to allow electric current flow through its pull resistor ($R_{PU0}$-$R_{PUn}$) branch, thereby enabling the corresponding pull up resistor ($R_{PU0}$-$R_{PUn}$) in the chip-level status indication circuit of the memory system 400.

It should be understood that the pull up resistors ($R_{PU0}$-$R_{PUn}$), when enabled, are included in the voltage divider network defined by the resistors ($R_{D0}$-$R_{Dn}$). In this role, the resistors ($R_{PU0}$-$R_{PUn}$) serve to segment the voltage range extending between the supply level voltage (VCC) and the reference ground potential 111, such that a given contiguous voltage segment at the common status node 405 is uniquely allocated to a given memory component (403A-403n). Thus, when a given pull up resistor ($R_{PU0}$-$R_{PUn}$) is enabled, the voltage level present at the common status node 405 is indicative of the operational status of the memory chip (Chip 0-Chip n) within the memory component (403A-403n) corresponding to the given pull up resistor ($R_{PU0}$-$R_{PUn}$).

FIG. 5 shows a table illustrating an example operation of the chip level status indication circuit of memory system 400, in accordance with one embodiment of the present invention. In the example of FIG. 4, there are four memory components, memory component 0 (403A) through memory component 3 (403D). There are four pull up resistors ($R_{PU0}$-$R_{PU3}$) corresponding to memory components 0 through 3 (403A-403D). The four pull up resistors ($R_{PU0}$-$R_{PU3}$) have respective resistance values of 1000 ohms, 14200 ohms, 30000 ohms, and 48000 ohms, respectively. When a particular memory component (403A-403D) is selected through the corresponding chip enable signal (CE0-CE3), the corresponding pull resistor ($R_{PU0}$-$R_{PU3}$) is enabled. In the table of FIG. 5, the asserted chip enable signal (CE0-CE3) is shown in the "CE" column, and the corresponding resistance value of the enabled pull up resistor ($R_{PU0}$-$R_{PU3}$) is shown in the "$R_{PU}$" column. Also, in the example of FIG. 5, each of the resistors ($R_{D0}$-$R_{D3}$) in the memory chips (Chip 0-Chip 3), as implemented in each memory component 0 through 3 (403A-403D), have an equal resistance value of 20000 ohms. A parallel resistance of the currently enabled resistors ($R_{D0}$-$R_{Dn}$) in the chip level status circuit is shown in the "$R_{PD}$" column. Therefore, in the example of FIG. 5, the voltage level measured at the common status node 405 (as shown in the "$V_{Busy}$" column) indicates how many of the memory chips (Chip 0-Chip 3) are in the busy operational state versus the ready operational state, in the memory component (403A-403D) corresponding to the asserted chip enable signal (CE0-CE3).

Given the structure of the chip level status indication circuit of FIG. 4 and the example operation of FIG. 5, it should be understood that the voltage divider network formed by the resistors ($R_{D0}$-$R_{Dn}$) and ($R_{PU0}$-$R_{PU3}$) allows the combined operational status of the memory chips (Chip 0-Chip n) in a selected memory component (403A-403n) to be gleaned from measurement of the single voltage level value at the common status node 405. Further, if each of the resistors ($R_{D0}$-$R_{Dn}$) has an equal resistance value, then the single voltage level value measured at the common status node will indicate how many of the memory chips (Chip 0-Chip n) in the selected memory component (403A-403D) are busy versus ready. Additionally, if each of the resistors ($R_{D0}$-$R_{Dn}$) has a different, i.e., unique, resistance value, then the single voltage level value measured at the common status node will indicate which particular memory chips (Chip 0-Chip n) in the selected memory component (403A-403D) are busy versus ready.

Figure 6:
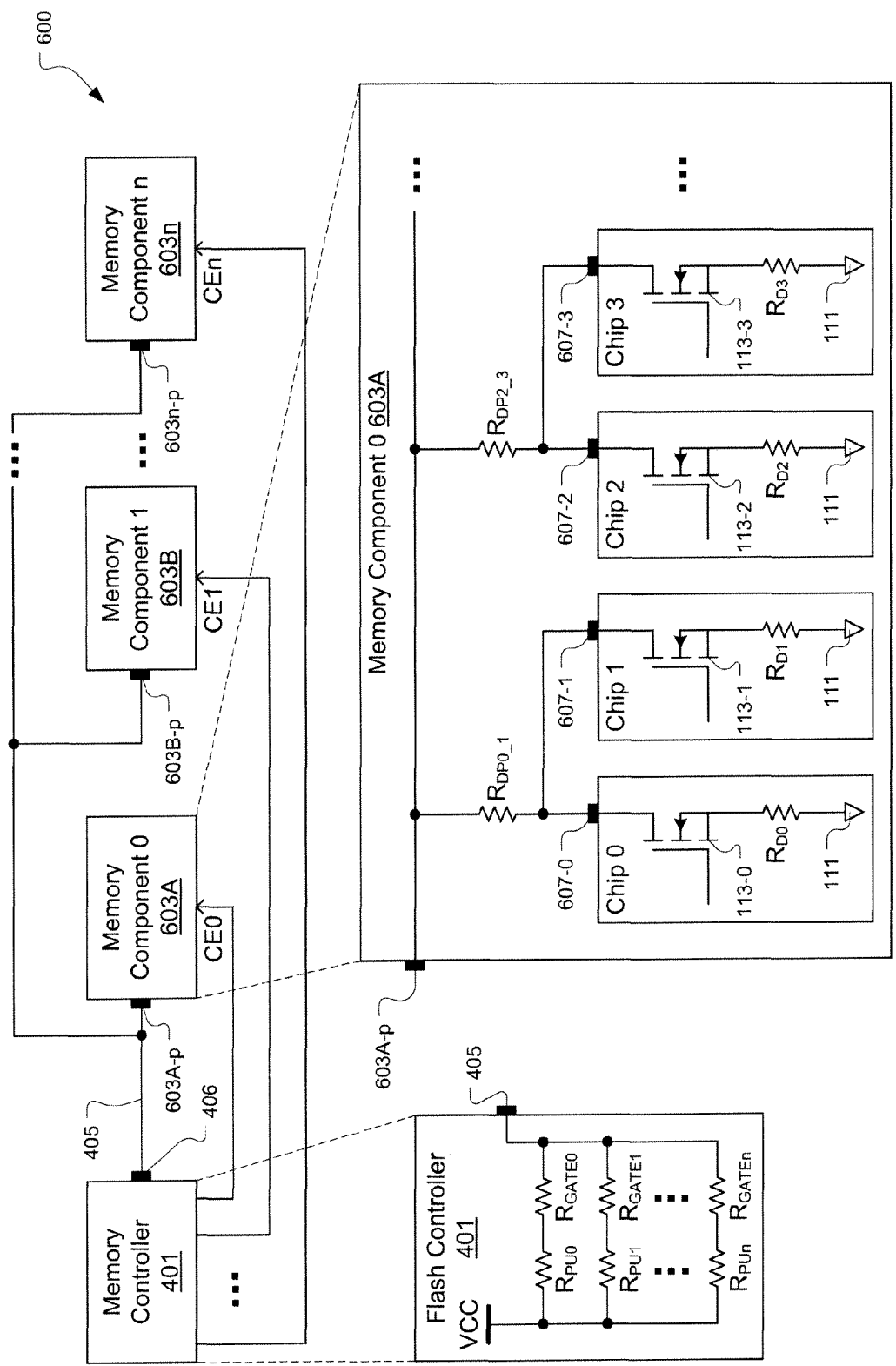
FIG. 6 shows a memory system defined to provide a chip-level status indication circuit, in accordance with another embodiment of the present invention.

FIG. 6 shows a memory system 600 defined to provide a chip-level status indication circuit, in accordance with another embodiment of the present invention. The memory system 600 is similar to the memory system 400 in that it includes the memory controller 401 and pull up resistors ($R_{PU0}$-$R_{PU3}$), as previously described with regard to memory system 400 of FIG. 4. The memory system 600 includes memory components (603A-603n) having respective status pins (603A-p-603n-p) electrically connected to the common status node 405. As mentioned above, the common status node 405 is electrically connected to a status port 406 of the memory controller 401.

The memory system 600 differs from memory system 400 in the implementation of the voltage divider network with the chip level status indication circuit. As shown in the expanded view of the memory component 0 (603A) status circuit, the memory chips (Chip 0-Chip n) include the resistors ($R_{D0}$-$R_{Dn}$) disposed in the same manner as previously described with regard to the memory system 400 of FIG. 4. However, in the memory components (603A-603D), additional resistors ($R_{DP0\_1}$, $R_{DP2\_3}$, ... $R_{DPn-1\_n}$) are disposed within the status circuit outside of the memory chips (Chip 0-Chip n) such that each of the additional resistors ($R_{DP0\_1}$, $R_{DP2\_3}$, ... $R_{DPn-1\_n}$) is electrically connected between a unique pair of status pads (607-0-607-n) and the common status node 405, and such that each status pad (607-0-607-n) is connected to one of the additional resistors ($R_{DP0\_1}$, $R_{DP2\_3}$, ... $R_{DPn-1\_n}$).

In one embodiment, the resistors ($R_{D0}$-$R_{Dn}$) are defined to have a substantially equal resistance level, such that memory chips (Chip 0-Chip n) are defined in a like manner. Also in this embodiment, the additional resistors ($R_{DP0\_1}$, $R_{DP2\_3}$, ... $R_{DPn-1\_n}$) are defined to each have a different resistance level. Therefore, the additional resistors ($R_{DP0\_1}$, $R_{DP2\_3}$, ... $R_{DPn-1\_n}$) serve to further segment the possible voltage levels at the common status node 405, such that a particular voltage level measured at the common status node 405 is indicative of operation of a particular grouping of memory chips (Chip 0-Chip n) within a selected memory component (603A-603n), i.e., of a particular operational state combination of the memory chips (Chip 0-Chip n). Moreover, it should be appreciated that the additional resistors ($R_{DP0\_1}$, $R_{DP2\_3}$, ... $R_{DPn-1\_n}$) can be implemented outside of the memory chips (Chip 0-Chip n), such as on a printed circuit board (PCB) of the memory components (603A-603n), thereby providing an economical and straightforward way of further segmenting the possible voltage levels at the common status node 405 among the possible operational state combinations of the memory chips (Chip 0-Chip n).

FIG. 7 shows a table illustrating an example operation of the chip level status indication circuit of memory system 600, in accordance with one embodiment of the present invention. In the example of FIG. 7, there are four memory components, memory component 0 (603A) through memory component 3 (603D). There are four pull up resistors ($R_{PU0}$-$R_{PU3}$) corresponding to memory components 0 through 3 (603A-603D). The four pull up resistors ($R_{PU0}$-$R_{PU3}$) have respective resistance values of 64000 ohms, 16000 ohms, 4000 ohms, and 1000 ohms, respectively. When a particular memory component (603A-603D) is selected through the corresponding chip enable signal (CE0-CE3), the corresponding pull resistor ($R_{PU0}$-$R_{PU3}$) is enabled. In the table of FIG. 7, the asserted chip enable signal (CE0-CE3) is shown in the "CE" column, and the corresponding resistance value of the enabled pull up resistor ($R_{PU0}$-$R_{PU3}$) is shown in the "$R_{PU}$" column.

Also, in the example of FIG. 7, each of the resistors ($R_{D0}$-$R_{D3}$) in the memory chips (Chip 0-Chip 3) implemented in each memory component 0 through 3 (603A-603D), have different resistance values of 1750 ohms, 2750 ohms, 4000 ohms, and 5000 ohms, respectively. Parallel resistances of the currently enabled chip-level resistors ($R_{D0}$-$R_{Dn}$) are shown in the "RD1∥RD0" and "RD3∥RD2" columns. A total resistance of the currently enabled resistors ($R_{PU0}$-$R_{PU3}$) and ($R_{D0}$-$R_{Dn}$) in the chip level status circuit is shown in the "$R_{PD}$" column.

Therefore, in the example of FIG. 7, the voltage level measured at the common status node 405 (shown in "$V_{Busy}$" column) indicates which ones of the memory chips (Chip 0-Chip 3) are in the busy operational state versus the ready operational state, in the memory component (603A-603D) corresponding to the asserted chip enable signal (CE0 through CE3). Given the structure of the chip level status indication circuit of FIG. 6 and the example operation of FIG. 7, it should be understood that the voltage divider network formed by the resistors ($R_{D0}$-$R_{Dn}$), ($R_{DP0\_1}$, $R_{DP2\_3}$, ...

$R_{DPn-1\_n}$), and ($R_{PU0}$-$R_{PU3}$) allows the combined operational status of the memory chips (Chip 0-Chip n) in a selected memory component (603A-603n) to be gleaned from measurement of the single voltage level value at the common status node 405.

Figure 8:
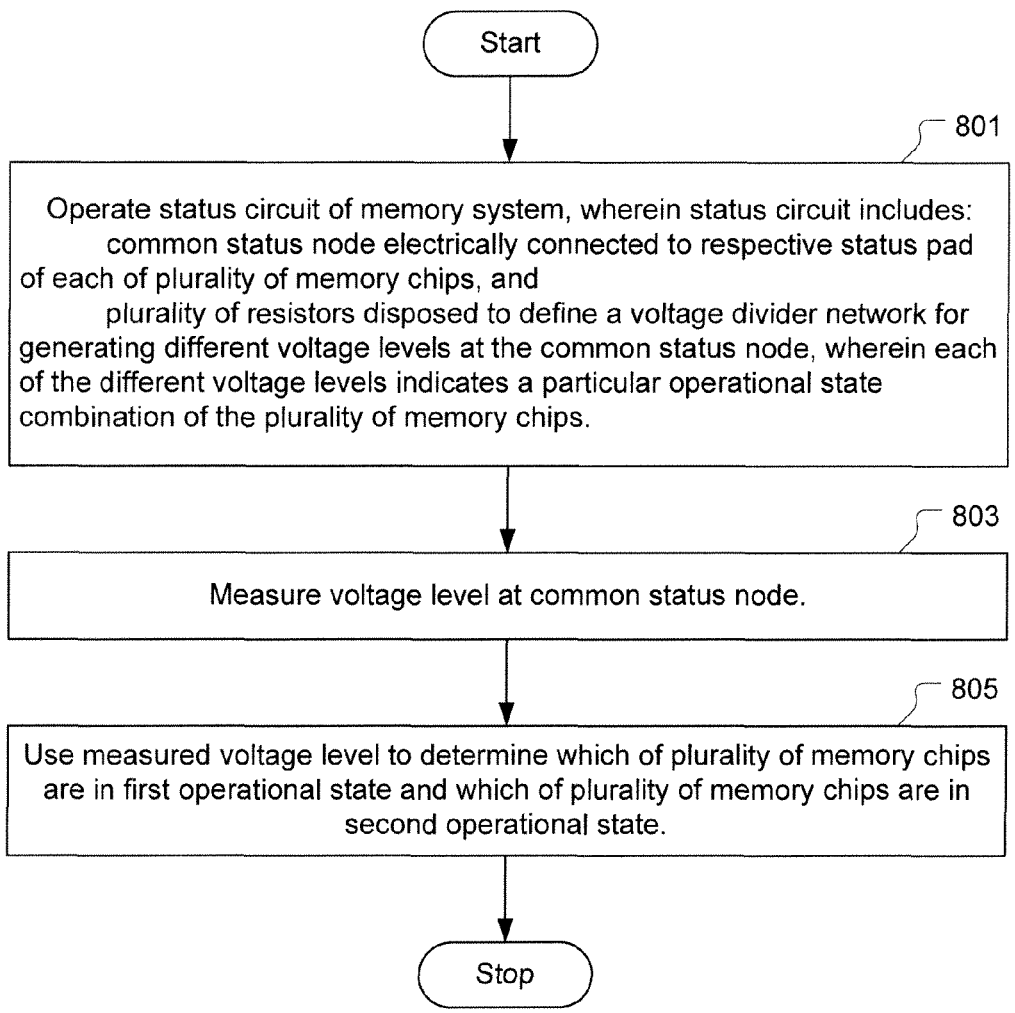
FIG. 8 shows a method for operating a memory system, in accordance with one embodiment of the present invention.

FIG. 8 shows a method for operating a memory system, in accordance with one embodiment of the present invention. The method includes an operation 801 in which a status circuit of the memory system is operated. The status circuit includes a common status node electrically connected to a respective status pad of each of a plurality of memory chips, such as the common status node (105/405) electrically connected to the status pads (107-0-107-n, 407-0-407-n, 607-0-607-n) of the memory chips (Chip 0-Chip n) in the above-described embodiments. The status circuit further includes a plurality of resistors disposed to define a voltage divider network for generating different voltage levels at the common status node, such as resistors ($R_{CMP0}$-$R_{CMPn}$, $R_{D0}$-$R_{Dn}$, $R_{DP0\_1}$-$R_{DPn-1\_n}$, $R_{PU}$, $R_{PU0}$-$R_{PUn}$) in the above-described embodiments. Each of the different voltage levels indicates a particular operational state combination of the plurality of memory chips.

More specifically, each of the plurality of memory chips is either in a first operational state or a second operational state. In one embodiment, the first operational state of a given memory chip is a busy operational state indicating that the given memory chip is processing an instruction, and the second operational state of the given memory chip is a ready state indicating that the given memory chip is idle and waiting to receive an instruction to process. Also, the different voltage levels possible at the common status node are distributed within a voltage range extending from a power supply voltage level to a reference ground voltage level.

The method also includes an operation 803 for measuring a voltage level at the common status node. An operation 805 is then performed to use the measured voltage level to determine which of the plurality of memory chips are in the first operational state and which of the plurality of memory chips are in the second operational state. In one embodiment, each of the different voltage levels indicates different numbers of the plurality of memory chips in the first operational state versus the second operational state. In another embodiment, each of the different voltage levels indicates different combinations, i.e., which ones, of the plurality of memory chips in the first operational state versus the second operational state.

The method can further include an operation for issuing a chip enable signal to select a particular memory component of a plurality of memory components. Each of the plurality of memory components includes a separate instance of the plurality of memory chips. Therefore, issuing the chip enable signal to select the particular memory component causes the voltage level at the common status node to convey a combined operational status of the plurality of memory chips of the particular memory component that is selected.

The method can also include an operation for generating a look-up-table to specify which of the plurality of memory chips are in the first operational state versus the second operational state at each of the different voltage levels at the common status node. Then, the voltage level measured at the common status node is used to determine which of the plurality of memory chips are in the first operational state and which of the plurality of memory chips are in the second operational state by querying the look-up-table at the measured voltage level. In one embodiment, the look-up-table includes a subset of the different voltage levels that are possible at the common status node. The subset can be based on a user-defined memory system status resolution. For example, if the user is concerned with a subset of the possible memory chip operational state conditions, then the look-up-table may be defined to represent the subset of memory chip operational state conditions by excluding other possible operational state conditions.

It should be understood that the memory components, memory chips, and memory controller as discussed herein include additional circuitry and components that are not described herein to avoid unnecessarily obscuring the present invention. Furthermore, it should be understood that the memory systems disclosed herein, including the status circuits and associated components, are defined to be compatible and interface with the additional circuitry of the various memory components, memory chips, and memory controller.

It should be appreciated that the voltage divider network topologies shown in the various memory system status circuit embodiments disclosed herein can be efficiently implemented in existing memory systems. Also, the resistors of these voltage divider networks formed within the status circuits provide an additional benefit of lowering a sink current within the status circuits, thereby providing increased efficiency in power consumption by the memory systems. Additionally, the resistors of the voltage divider networks within the status circuits provide for short level transition times in some implementations, with correspondingly shorter voltage steps.

The invention described herein can be embodied as computer readable code on a computer readable medium. For example, the computer readable code can include the layout data file within which one or more layouts corresponding to the memory chips are stored. The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the memory systems as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate.

At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A memory system, comprising:
    a status circuit having a common status node electrically connected to a respective status pad of each of a plurality of memory chips; and
    a plurality of resistors disposed within the status circuit to define a voltage divider network for generating different voltage levels at the common status node, wherein each of the different voltage levels indicates a particular operational state combination of the plurality of memory chips.

2. A memory system as recited in claim 1, wherein the plurality of resistors have different resistance levels to define a unique combined resistance for each one of the plurality of memory chips, thereby generating a different voltage level at the common status node when current flows through different combinations of the plurality of memory chips.

3. A memory system as recited in claim 1, wherein the plurality of resistors have a same resistance level, thereby generating a different voltage level at the common status node when current flows through a different number of the plurality of memory chips.

4. A memory system as recited in claim 1, wherein each of the plurality of memory chips is operating in either a first operational state or a second operational state, wherein the first operational state of a given memory chip is a busy operational state indicating that the given memory chip is processing an instruction, and wherein the second operational state of the given memory chip is a ready state indicating that the given memory chip is idle and waiting to receive an instruction to process.

5. A memory system including a component level status indicator circuit, comprising:
    a plurality of memory components each including a respective status pin defined to communicate an electrical signal indicating a memory component status; and
    a plurality of resistors respectively connected between the status pins of the plurality of memory components and a system level status node and defined to generate a voltage at the system level status node indicating which ones of the plurality of memory components are in a first operational state and which ones of the plurality of memory components are in a second operational state.

6. A memory system including a component level status indicator circuit as recited in claim 5, wherein each memory component includes at least one memory chip, and wherein each memory chip includes an open-drain device connected between a respective status pad and a reference ground potential.

7. A memory system including a component level status indicator circuit as recited in claim 6, wherein each status pad of each memory chip within a given memory component is connected to the status pin of the given memory component, such that electric current flow through the status pad of any memory chip within the given memory component corresponds to electric current flow through the status pin of the given memory component.

8. A memory system including a component level status indicator circuit as recited in claim 5, further comprising:
    a pull up resistor connected between a power supply and the system level status node such that a supply voltage level exists at the system level status node when all of the plurality of memory components are in the second operational state.

9. A memory system including a component level status indicator circuit as recited in claim 8, wherein the first operational state of a given memory component is a busy operational state indicating that the given memory component is processing an instruction, and wherein the second operational state of the given memory component is a ready state indicating that the given memory component is idle and waiting to receive an instruction to process.

10. A memory system including a component level status indicator circuit as recited in claim 5, further comprising:
    a plurality of pull up resistors respectively corresponding to the plurality of memory components, each of the plurality of pull up resistors electrically connected between a power supply and the system level status node.

11. A memory system including a component level status indicator circuit as recited in claim 10, wherein each of the plurality of pull up resistors is uniquely associated with one of the plurality of memory components such that selection of a given memory component will enable only the pull up resistor uniquely associated with the given memory component.

12. A memory system including a component level status indicator circuit as recited in claim 11, wherein each of the plurality of pull up resistors has a different resistance level such that distinct voltage levels at the system level status node are uniquely associated with a given memory component and operational states of memory chips within the given memory component.

13. A method for operating a memory system, comprising:
    operating a plurality of memory chips such that each of the plurality of memory chips is in any given one of a plurality of operational states; and
    generating a different voltage level at a common status node for each unique combination of operational states of the plurality of memory chips.

14. A method for operating a memory system as recited in claim 13, wherein each of the different voltage levels indicates different numbers of the plurality of memory chips in a first operational state versus a second operational state.

15. A method for operating a memory system as recited in claim 13, wherein each of the different voltage levels indicates different combinations of the plurality of memory chips in a first operational state versus a second operational state.

16. A method for operating a memory system as recited in claim 13, further comprising:
issuing a chip enable signal to select a particular memory component of a plurality of memory components, wherein each of the plurality of memory components includes a separate instance of the plurality of memory chips, whereby issuing the chip enable signal to select the particular memory component causes the voltage level at the common status node to convey a combined operational status of the plurality of memory chips of the particular memory component.

17. A method for operating a memory system as recited in claim 13, further comprising:
generating a look-up-table to specify which of the plurality of memory chips are in a first operational state versus a second operational state at each of the different voltage levels that are possible at the common status node.

18. A method for operating a memory system as recited in claim 17, further comprising:
measuring a voltage level at the common status node; and
using the measured voltage level at the common status node to query the look-up-table to determine which of the plurality of memory chips are in the first operational state and which of the plurality of memory chips are in the second operational state.

19. A method for operating a memory system as recited in claim 17, wherein the look-up-table includes a subset of the different voltage levels that are possible at the common status node, wherein the subset is based on a user-defined memory system status resolution.

20. A method for operating a memory system as recited in claim 13, wherein the plurality of operational states includes a first operational state and a second operational state, wherein the first operational state is a busy operational state, and wherein the second operational state is a ready operational state.

* * * * *